(12) United States Patent
Leenders et al.

(10) Patent No.: US 7,170,580 B2
(45) Date of Patent: Jan. 30, 2007

(54) LITHOGRAPHIC APPARATUS, PROJECTION SYSTEM, METHOD OF PROJECTING AND DEVICE MANUFACTURING METHOD

(75) Inventors: Martinus Hendrikus Antonius Leenders, Rotterdam (NL); Henrikus Herman Marie Cox, Eindhoven (NL); Leon Martin Levasier, Hedel (NL)

(73) Assignee: ASML Netherlands B.V., Veldhoven (NL)

( * ) Notice: Subject to any disclaimer, the term of this patent is extended or adjusted under 35 U.S.C. 154(b) by 92 days.

(21) Appl. No.: 10/823,772

(22) Filed: Apr. 14, 2004

(65) Prior Publication Data

US 2004/0257549 A1    Dec. 23, 2004

(30) Foreign Application Priority Data

Apr. 14, 2003    (EP)    ................... 03076107

(51) Int. Cl.
 G03B 27/42    (2006.01)
 G03B 27/52    (2006.01)
 G03B 27/70    (2006.01)
(52) U.S. Cl. .............................. 355/53; 355/55; 355/57
(58) Field of Classification Search ................. 355/53, 355/55, 57; 356/399, 450; 359/843
 See application file for complete search history.

(56) References Cited

U.S. PATENT DOCUMENTS

| 6,490,025 | B1 | 12/2002 | Makinouchi et al. | |
|---|---|---|---|---|
| 6,549,270 | B1* | 4/2003 | Ota ............................. | 355/55 |
| 6,593,585 | B1 | 7/2003 | Loopstra et al. | |
| 6,744,511 | B1* | 6/2004 | Saiki et al. .................. | 356/399 |
| 2002/0044269 | A1 | 4/2002 | Yonekawa et al. | |
| 2003/0042920 | A1 | 3/2003 | Kenmoku | |
| 2003/0151728 | A1* | 8/2003 | Nishi .......................... | 355/30 |

FOREIGN PATENT DOCUMENTS

| EP | 0 866 374 A2 | 9/1998 |
|---|---|---|
| EP | 1 107 068 A2 | 6/2001 |
| EP | 1 137 054 A1 | 9/2001 |
| JP | 9-326362 | 12/1997 |
| JP | 10-261580 | 9/1998 |
| JP | 11-8189 | 1/1999 |
| JP | 2000-286189 | 10/2000 |
| JP | 2001-351855 | 12/2001 |
| JP | 2002-33274 | 1/2002 |
| JP | 2004-228149 | 8/2004 |
| KR | 1998-080359 | 11/1998 |

OTHER PUBLICATIONS

English translation of Korean Office Action issued in Korean Application No. 10-2004-0025255 dated Jan. 23, 2006.

* cited by examiner

Primary Examiner—Peter B. Kim
(74) Attorney, Agent, or Firm—Pillsbury Winthrop Shaw Pittman, LLP

(57) ABSTRACT

A projection system includes at least one projection device configured to receive a beam of radiation coming from a first object and project the beam to a second object. The projection system further includes a sensor configured to measure a spatial orientation of the at least one projection device and a processing unit configured to communicate with the at least one sensor. The processing unit is configured to communicate with a positioning device configured to adjust the position of at least one of the first object and the second object based on the measured spatial orientation of the at least one projection device.

18 Claims, 4 Drawing Sheets

LITHOGRAPHIC APPARATUS, PROJECTION SYSTEM, METHOD OF PROJECTING AND DEVICE MANUFACTURING METHOD

CROSS REFERENCE TO RELATED APPLICATION

This application claims priority to European Patent Application 03076107.6, filed Apr. 14, 2003, the entire contents of which are incorporated herein by reference.

BACKGROUND OF THE INVENTION

1. Field of the Invention

The present invention relates to a lithographic apparatus, a projection system, a method of projecting and a device manufacturing method.

2. Description of the Related Art

The term "patterning devices" as here employed should be broadly interpreted as referring to devices that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An examples of such a patterning devices is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case extreme ultraviolet light is used, only reflective masks can be used, for reasons known to those skilled in the art. In the case of a mask, the support will generally be a mask table, which ensures that the mask can be held at a desired position in the incoming radiation beam, and that it can be moved relative to the beam if so desired.

Another example of a patterning device is a programmable mirror array. One example of such a device is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronic devices. In both of the situations described hereabove, the patterning devices can include one or more programmable mirror arrays. More information on mirror arrays can be gleaned, for example, from U.S. Pat. Nos. 5,296,891 and 5,523,193, and PCT Patent Application Publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such examples should be seen in the broader context of the patterning devices as hereabove set forth.

Lithographic projection apparatus can be used, for example, in the manufacture of integrated circuits (ICs). In such a case, the patterning devices may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper or step-and-repeat apparatus. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796.

The projection system as described above usually includes one or more, for example six, projection devices, such as lenses and/or mirrors. The projection devices transmit the beam through the projection system and direct it to the target portion. In case the beam is EUV-radiation, mirrors should be used in stead of lenses, in order to project the beam, since lenses are not translucent to EUV-radiation.

When an extreme ultraviolet projection beam is used for projecting relatively small patterns, the demands for the projection system concerning the accuracy are rather high. For example, a mirror that is positioned with a tilting error of 1 nrad can result in a projection error of approximately 4 nm on the wafer, assuming an optical light path of 1 m.

A projection system for projecting an extreme ultraviolet projection beam includes, for example, 6 mirrors. Usually, one of the mirrors has a fixed spatial orientation, while the other five are mounted with an active mount. The actuator in the active mount can be a Lorentz motor, a piezoelectric actuator, a pneumatic actuator, or other type. These mounts can preferably adjust the orientation of the mirrors in 6 degrees of freedom (6-DOF-mounts) using Lorentz motors. The projection system further includes position sensors to measure the spatial orientation of the projection devices, e.g. by measuring the position of the projection devices relative to the projection system.

The projection system is fixedly mounted, for example, to a metrology frame, using a medium soft mount with a suspension frequency between 10 and 100 Hz. Typically a 30 Hz mounting device is used. This is done to stabilize the beam and isolate it from vibrations and disturbances coming from the metrology frame environment and disturbances from adjacent systems. As a result of this mounting, unwanted high frequency disturbances above the 30 Hz are almost completely filtered out. However, disturbances having a frequency of approximately 30 Hz, are not stopped by the mounting device and are even amplified.

SUMMARY OF THE INVENTION

It is an aspect of the present invention to provide a projection system that is less sensitive to vibrations and disturbances. This and other aspects are achieved according to the present invention in a projection system including at least one projection device configured to receive a beam of radiation coming from a first object and project the beam of radiation to a second object; at least one sensor configured to measure a spatial orientation of the at least one projection device; and a processing unit configured to: communicate with the at least one sensor; and communicate with a positioning device configured to adjust the position of at least one of the first object and the second object based on the measured spatial orientation of the at least one projection device.

According to a further aspect of the present invention, a method for projecting a beam of radiation coming from a first object, and received by at least one projection device, to a second object includes measuring a spatial orientation of the at least one projection device; determining an orientation error in the spatial orientation of the at least one projection device; computing a projection error of an image projected on the second object based on the orientation error in the spatial orientation of the at least one projection device; and adjusting a position of at least one of the first object and the second object to minimize a projection error.

According to a still further aspect of the present invention, a lithographic apparatus includes an illumination system configured to provide a beam of radiation; a support configured to support a patterning device, the patterning device configured to impart the beam with a pattern in its cross-section; a substrate table configured to hold a substrate; a projection system configured to project the patterned beam onto a target portion of the substrate. The projection system includes at least one projection device configured to receive a beam of radiation coming from a first object and project the beam of radiation to a second object; at least one sensor configured to measure a spatial orientation of the at least one projection device; and a processing unit configured to: communicate with the at least one sensor; and communicate with a positioning device configured to adjust the position of at least one of the first object and the second object based on the measured spatial orientation of the at least one projection device.

According to an even further aspect of the invention, a device manufacturing method includes providing a substrate at least partially covered by a layer of radiation sensitive material; and projecting a beam of radiation coming from a patterning device, and received by at least one projection device, to the substrate. The projecting includes measuring a spatial orientation of the at least one projection device; determining an orientation error in the spatial orientation of the at least one projection device; computing a projection error of an image projected on the substrate based on the orientation error in the spatial orientation of the at least one projection device; and adjusting a position of at least one of the patterning device and the substrate to minimize a projection error.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
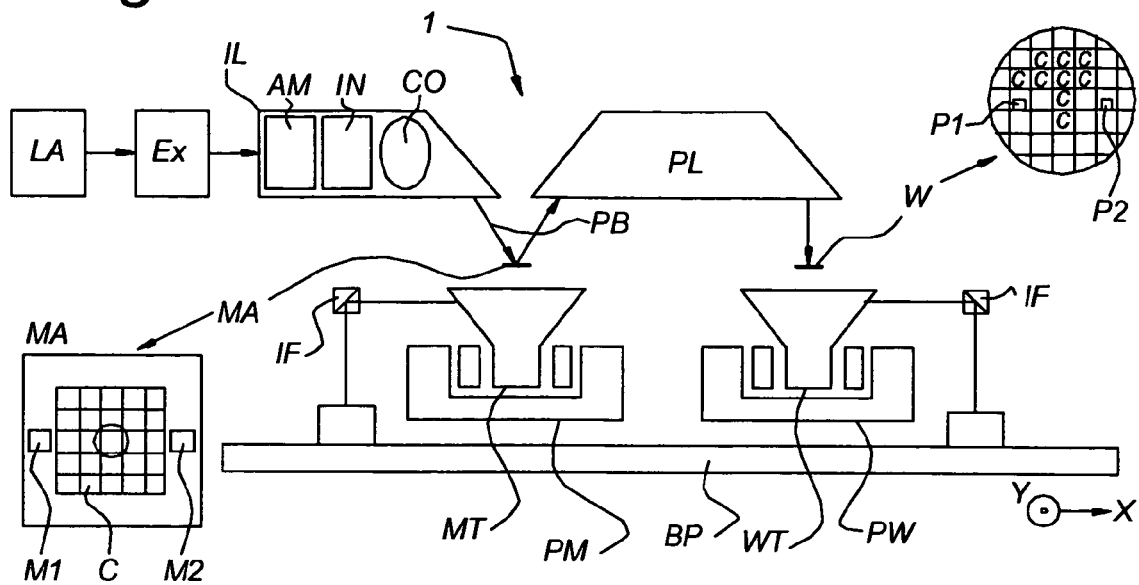
FIG. 1 depicts a lithographic projection apparatus according to the present invention.

FIG. 1 schematically depicts a lithographic projection apparatus 1 including a radiation system Ex, IL, configured to supply a beam PB of radiation (e.g. EUV-radiation). In this particular case, the radiation system also includes a radiation source LA. A first object table (mask table) MT is provided with a mask holder to hold a mask MA (e.g. a reticle) and is connected to a first positioning devices PM that accurately positions the mask with respect to a projection system ("lens") PL. A second object table (substrate table) WT is provided with a substrate holder to hold a substrate W (e.g. a resist-coated silicon wafer) and is connected to a second positioning devices PW that accurately positions the substrate with respect to the projection system PL. The projection system ("lens") PL (e.g., mirrors for EUV-radiation) images an irradiated portion of the mask MA onto a target portion C (e.g., including one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning devices, such as a programmable mirror array of a type as referred to above.

The source LA (e.g. EUV-source) produces radiation. This radiation is fed into an illumination system (illuminator) IL, either directly or after having traversed conditioning devices, such as a beam expander Ex, for example. The illuminator IL may include an adjusting device AM to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors). This latter scenario is often the case when the source LA is an excimer laser.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning devices PW and a position sensor (e.g. an interferometric position measuring devices IF), the substrate table WT can be moved accurately to position different target portions C in the path of the beam PB. Similarly, the first positioning device PM can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
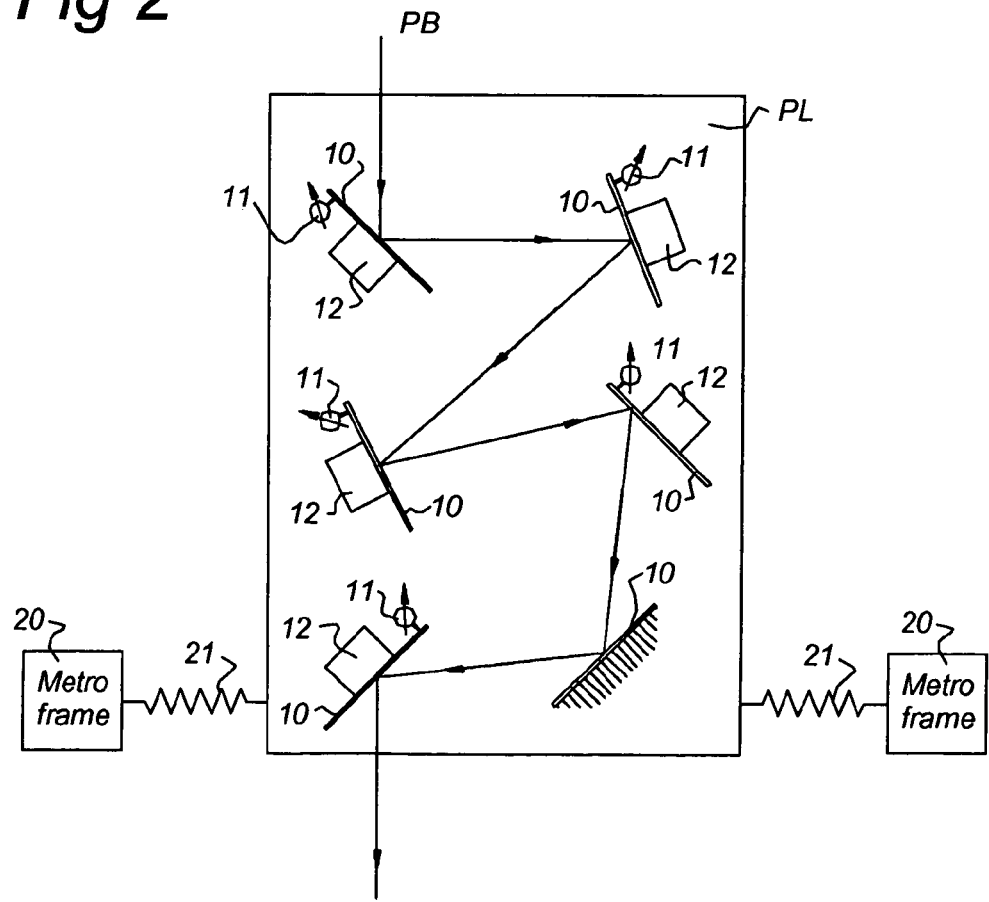
FIG. 2 depicts a projection system according to the prior art.

FIG. 2 depicts an example of a known projection system PL, as already discussed above. The projection system PL comprises one or more, typically six, projection devices 10, here shown as mirrors. One of the projection devices 10 is fixedly mounted to the frame of the projection system PL, the other five projection devices 10 are mounted with the use of a 6-DOF-actuated mount 12, that can adjust the spatial orientation of the projection devices 10 in preferably 6 degrees of freedom. The actuated mount can also be formed by a combination of passive DOF's and active DOF's. The projection system PL as a whole is fixedly mounted to, for example, a metrology frame 20 by a medium soft mounting device 21, with a suspension frequency between 10 and 50 Hz, typically a 30 Hz mounting device 21 connecting the projection system PL with the metrology frame 20. The projection system PL further includes sensors 11 to measure the relative position of the projection devices 10 with respect to the frame of the projection system PL. The orientation of the projection devices 10 is preferably measured relative to the projection system PL.

Figure 3A:
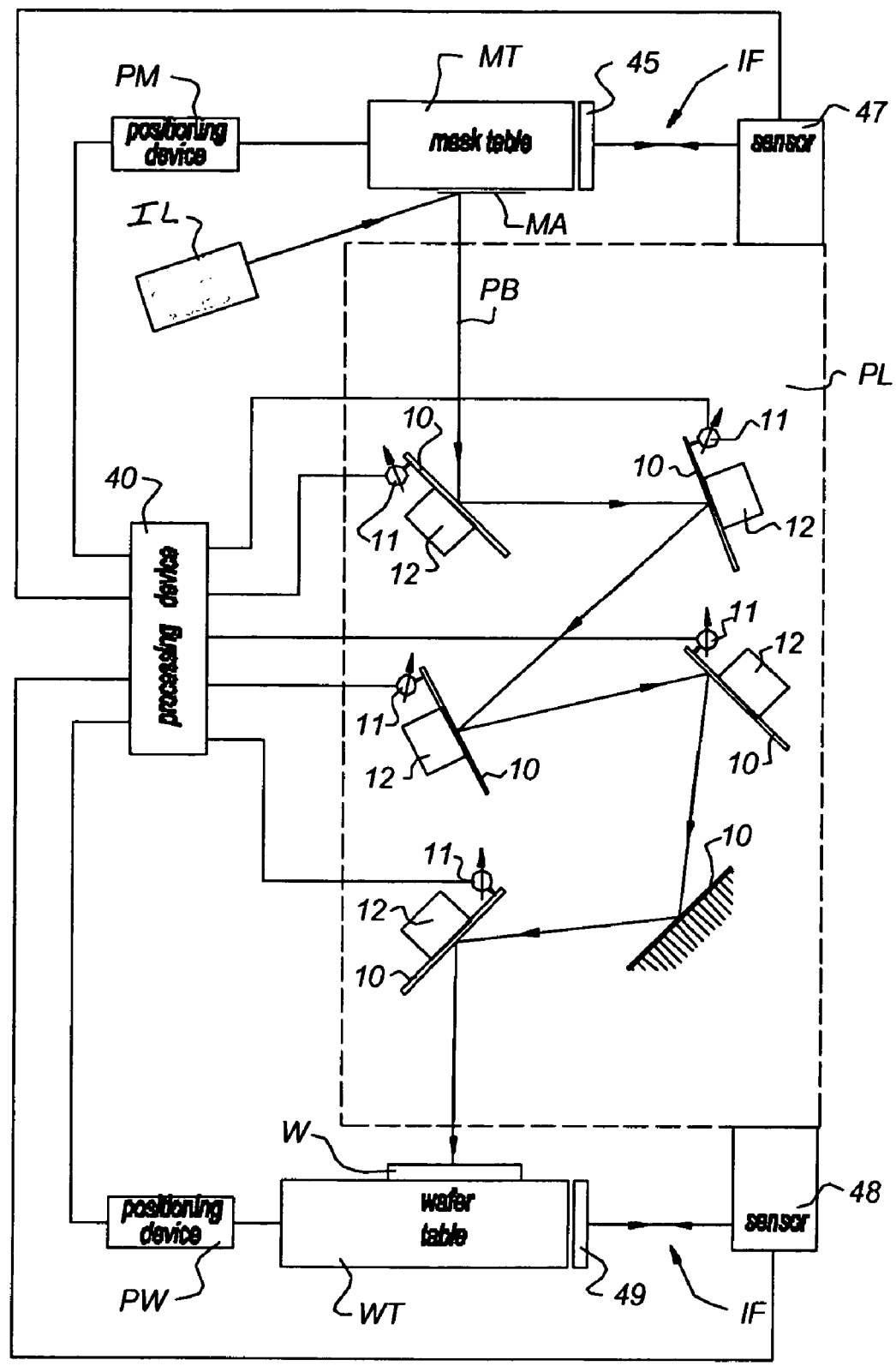
FIGS. 3a and 3b depict a projection system according to the present invention.

FIG. 3a shows a projection system PL according to the present invention, in which similar reference numbers refer to similar items as in FIG. 2. FIG. 3a shows a mask MA on a mask table MT. A beam PB is produced by the illuminator IL, that can be similar to the one discussed with reference to FIG. 1.

The projection system PL further includes a processing unit 40 configured to communicate with the sensors 11 and the 6-DOF-mounts 12. The sensors 11 can measure the spatial orientation of the projection devices 10, e.g. with respect to the projection system PL, and transmit that measured value to the processing unit 40.

Figure 4:
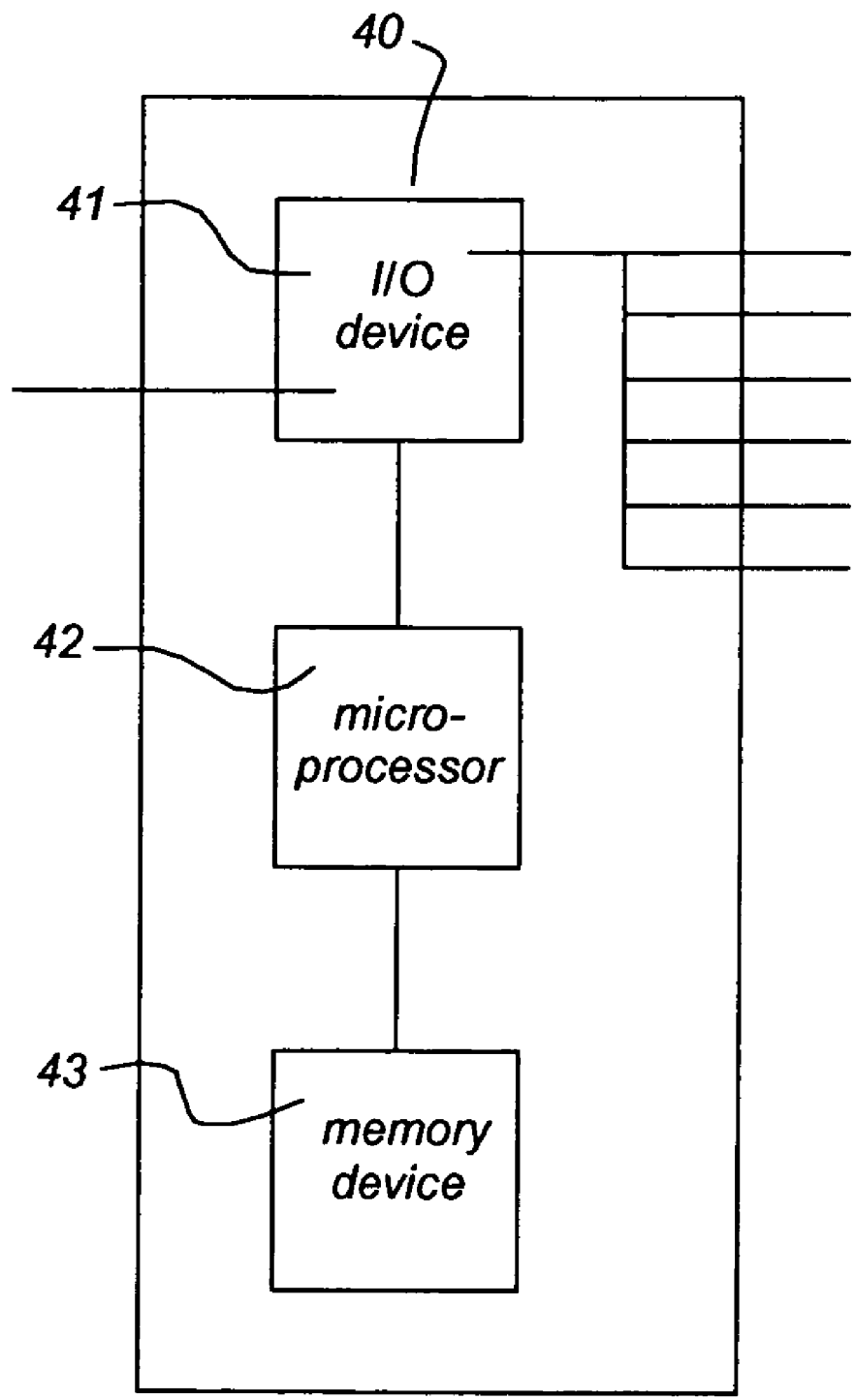
FIG. 4 depicts a processing unit according to the present invention.

The processing unit 40 can be configured as a computer with one or more processor devices, an example of which is shown in FIG. 4. The processing unit 40 may include a micro-processor 42 configured to communicate with a memory device 43 and an I/O-device 41. The I/O-device 41 is arranged to receive and transmit signals.

As is shown in FIG. 3*a*, the processing device 40 receives position input signals from sensors 11 of the projection devices and input signals from sensors 47 and 48 of the mask table MT and the wafer table WT, respectively. The sensors 11 measure the position of projection devices 10 with respect to an optical reference frame, e.g., the projection system PL, that becomes disturbed by vibrations on the metrology frame 20 as result of scanning forces, floor vibrations or other disturbances.

The memory 43 includes information about the desired ideal position (set point position) of each projection device 10. Any deviation of the desired position and the actual, or sensed/measured, position provides a position error. A correction, or control, signal is provided to the actuators 12 of the projection devices 10. These correction signals form the output of the processing device 40 that controls the actuators 12 of the projection devices 10 in such a way that the relative position error between projection devices 10 and the projection system PL is kept as small as possible. This control can be obtained by one or more position control loops that apply feedback and feedforward control outputs as result of a position error, velocity error, acceleration error and/or time integral of position error. The algorithms applied in the control loops are well known to those skilled in the art of servo control. The actuators 12 of the projection devices 10 are preferably of Lorentz type, but can also be electromagnetic, piezoelectric, pneumatic, or another motor type.

If the position control loops of the projection devices 10 have a high position bandwidth the control can be powerful enough to minimize the relative error of each individual projection device 10 to the projection system PL. If the projection devices 10 have the correct desired position and if all position errors are small enough, the combination of all projection devices 10 will result in a correct image of the mask pattern MA to the wafer W.

However, if the disturbances are high and or if the position bandwidth is not high enough, the residual position error of the projection devices 10 may be too large for a good imaging. It is possible to improve the image quality of the projection of the mask MA on the wafer W, by feeding the residual errors of the projection devices 10 to one of the positioning devices PM (mask table) and/or PW (wafer table). This method is referred to here as error feedthrough from the projection devices.

To do this, the contribution of each position error of each projection device 10 to the image on the wafer W must be known. This knowledge, the so-called sensitivity of the image error as function of position error, can be obtained in advance by a calibration step. If the optical system has 5 active mirrors, controlled in 6 DOF, the result will be a sensitivity matrix with 30 independent inputs and 6 outputs, stored in the processing device 40. The inputs are individual position errors of the projection devices 10. The output are the corrections for the wafer table WT position and/or the mask table MT position. The sensitivity matrix then contains $5 \times 6 \times 6 = 180$ gains that form the sensitivity of position error to image error on the wafer W. The 30 inputs and 6 outputs may or may not filter the input/output data. The weighted and filtered output then is added to the position sensor signal of the wafer table WT and/or mask table MT.

The position sensors 48 and 47 of the wafer table WT and the mask table MT can be an interferometric measuring device IF as is shown in FIG. 3*a*, including a sensor 48, 47 and a mirror 49, 45, respectively. The interferometric measuring devices IF measure the position of the wafer W and the mask MA, respectively, with respect to the projection system PL.

Optical encoders can also be used as position sensor. The position device or actuator of the wafer W and mask MA are preferable of Lorentz type, but can also be electromagnetic, piezoelectric, pneumatic, or another motor type.

Adding the weighted position error of the projection devices 10 to the position sensors 48 and 47 of the wafer table WT and the mask table MT, respectively, will further reduce the final image error of the mask pattern to the wafer W. Typically the position error of the projection devices 10 will be dominated by the frequency of the suspension of optical frame to the metrology frame 20. Typically position errors with 30 Hz frequency can be expected.

Those skilled in the art of position control can calculate that a 150 Hz servo bandwidth of the wafer table WT can give a reduction of approximately $1/0.3*(30/150)^2 = 0.13$ [–]. So a non-compensated position error at wafer level of 10 nanometer becomes only 1.3 nanometer, when this error feedthrough is applied.

In an alternative configuration the weighted position error of the projection devices 10 is not added to the position sensors 48 and/or 47 that form the control sensor input, but is added as a control output to the positioning devices PW and PM that position the wafer and mask.

A further improvement is using the second derivative of the position error signal of the projection devices 10 as an acceleration feed forward signal to the position loop of wafer W and/or mask MA.

Figure 3B:
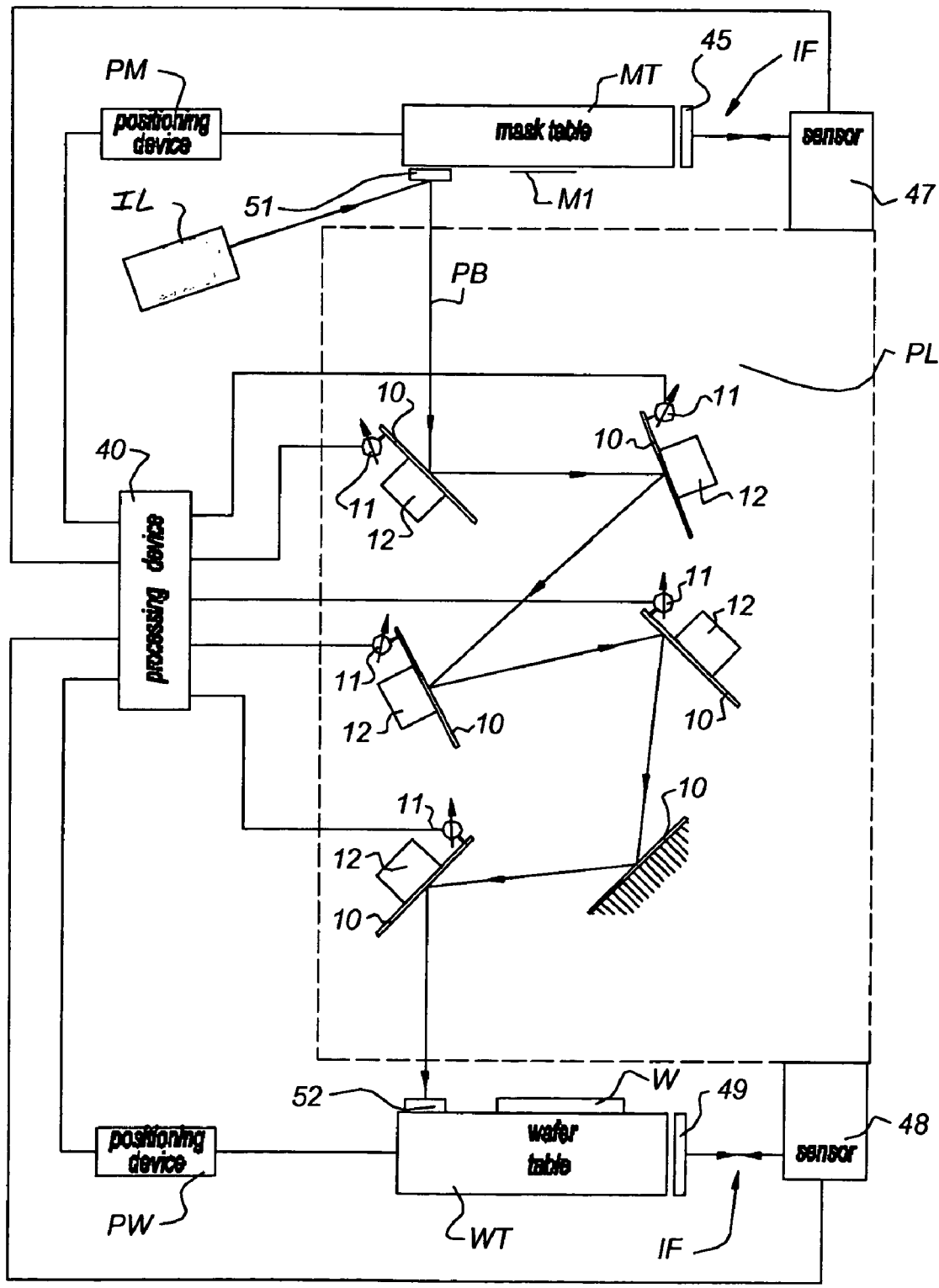

As is shown in FIG. 3*b*, the positioning of the mask table MT to the wafer table can also be monitored and calibrated by a TIS (Transmission Image Sensor) device. Such a TIS device will readily be understood by a person skilled in the art.

The TIS device is formed by a test mark 51 on the mask table MT and an optical receiver 52 attached to the wafer table WT. The light from the illuminator projects the marker image via the projection devices 10 to the optical receiver 52. The projected image is a 3D parabolic-like light intensity distribution. The maximum of this intensity distribution can be used to find the optimal 6 DOF-alignment of the mask table MT relative to the wafer table WT. The accuracy of this mask table MT to the wafer table WT alignment via the TIS device can also be improved if the position error measured by the sensors 11 is weighted with the sensitivity matrix (described above) and if the result is added to the calibration position signal of the sensor 48 and/or to the signal that forms the reference for the optimal or desired mask table MT to wafer table WT position in coordinates to the sensors 47 and 48.

The measured errors of the projection devices 10, i.e. the deviation between the ideal and the actual spatial orientation of the projection devices 10, can also be used to adjust the position of the projection devices 10. The overall error computed by the processing unit 40, as described above, can also be used to adjust the position of the projection devices 10, by controlling the actuators 12. The errors that remain after this adjustment (residual error) can be compensated for by adjusting the position of the wafer table WT and/or the mask table MT, as already described above. This residual error can be measured, but can also be determined based on the original measured error and the knowledge about the compensation signal sent to the actuators 12.

It is also possible to construct a time signal, representing the measured errors and convert this time signal into its frequency components. Certain frequency ranges can be compensated by adjusting the spatial orientation of the projection devices 10, other frequency ranges can be compensated by adjusting the position of the wafer table WT and/or the mask table MT.

In order to achieve desired or optimal results, the measured signal, representing the measured errors, can be filtered, using known filtering techniques. This can be done in order to control the positioning devices of the mask table PM, the wafer table PW and/or the projection devices 12 with a signal in a certain frequency range.

It will be understood that the invention as described here, can in general be applied to projecting a beam PB coming from a first object to a second object. For example, the first object can be a mask MA for use in lithographic technology and the second object can be a wafer W for use in lithographic technology. The beam PB can be a patterned projection beam as used in lithographic technology.

While exemplary embodiments of the present invention have been described above, it will be appreciated that the invention may be practiced otherwise than as described. The description is not intended to limit the present invention.

What is claimed is:

1. A projection system, comprising:
   a projection device configured to receive a beam of radiation coming from a first object and to project the beam of radiation to a second object;
   a sensor configured to measure a spatial orientation of the at least one projection device; and
   a processing unit configured to communicate with the sensor and with a positioning device, the positioning device configured to adjust the position of the projection device and at least one of the first object and the second object based on the measured spatial orientation of the projection devices,
   wherein the processing unit is configured to
      adjust the position of at least one of the first object and the second object based on the measured spatial orientation of the projection device in a first frequency range; and
      adjust the spatial orientation of the projection device based on the measured spatial orientation of the projection device in a second frequency range.

2. A projection system according to claim 1, wherein the positioning device is configured to adjust the position of at least one of the first object and the second object based on a residual error after adjusting the spatial orientation of the projection device.

3. A projection system according to claim 1, wherein the projection device comprises a mirror or a lens.

4. A projection system according to claim 1, wherein the projection device is mounted on a mounting device configured to actuate the projection device in at least one degree of freedom.

5. A projection system according to claim 1, wherein the beam of radiation is an extreme ultraviolet beam of radiation.

6. A projection system according to claim 1, wherein the processing unit is configured to communicate with a second sensor configured to determine a position of at least one of the first object and the second object.

7. A projection system according to claim 1, wherein the processing unit comprises an I/O-device, a micro-processor, and a memory device.

8. A method for projecting a beam of radiation coming from a first object, and received by a projection device, to a second object, the method comprising:
   measuring a spatial orientation of the projection device;
   determining an orientation error in the spatial orientation of the projection device;
   computing a projection error of an image projected on the second object based on the orientation error in the spatial orientation of the projection device; and
   adjusting a position of the projection device and at least one of the first object and the second object to minimize a projection error,
   wherein the adjusting comprises
      adjusting the position of at least one of the first object and the second object based on the measured spatial orientation of the projection device in a first frequency range; and
      adjusting the spatial orientation of the projection device based on the measured spatial orientation of the projection device in a second frequency range.

9. A method according to claim 8, further comprising calibrating an alignment of the first object to the second object in at least one degree of freedom.

10. A lithographic apparatus, comprising:
    an illumination system configured to provide a beam of radiation;
    a support configured to support a patterning device, the patterning device configured to impart the beam with a pattern in its cross-section;
    a substrate table configured to hold a substrate;
    a projection system configured to project the patterned beam onto a target portion of the substrate, the projection system comprising:
       a projection device configured to receive a beam of radiation coming from a first object and project the beam of radiation to a second object;
       a sensor configured to measure a spatial orientation of the projection device; and
       a processing unit configured to communicate with the sensor and with a positioning device, the positioning device configured to adjust the position of the projection device and at least one of the first object and the second object based on the measured spatial orientation of the projection device,
    wherein the processing unit is configured to
       adjust the position of at least one of the first object and the second object based on the measured spatial orientation of the projection device in a first frequency range; and
       adjust the spatial orientation of the projection device based on the measured spatial orientation of the projection device in a second frequency range.

11. An apparatus according to claim 10, wherein the positioning device is configured to adjust the position of at least one of the first object and the second object based on a residual error after adjusting the spatial orientation of the projection device.

12. An apparatus according to claim 10, wherein the projection device comprises a mirror or a lens.

13. An apparatus according to claim 10, wherein the projection device is mounted on a mounting device configured to actuate the projection device in at least one degree of freedom.

14. An apparatus according to claim 10, wherein the beam of radiation is an extreme ultraviolet beam of radiation.

15. An apparatus according to claim 10, wherein the processing unit is configured to communicate with a second sensor configured to determine a position of at least one of the first object and the second object.

16. An apparatus according to claim 10, wherein the processing unit comprises an I/O-device, a micro-processor, and a memory device.

17. A device manufacturing method, comprising:

projecting a beam of radiation coming from a patterning device, and received by a projection device, to a substrate at least partially covered by a layer of radiation sensitive material, the projecting comprising:

measuring a spatial orientation of the projection device;

determining an orientation error in the spatial orientation of the projection device;

computing a projection error of an image projected on the substrate based on the orientation error in the spatial orientation of the at least one projection device; and adjusting a position of the projection device and at least one of the patterning device and the substrate to minimize a projection error, wherein the adjusting comprises adjusting the position of at least one of the first object and the second object based on the measured spatial orientation of the projection device in a first frequency range; and adjusting the spatial orientation of the projection device based on the measured spatial orientation of the projection device in a second frequency range.

18. A method according to claim 17, further comprising:

calibrating an alignment of the patterning device to the substrate in at least one degree of freedom.

* * * * *